(12) United States Patent
Shanai et al.

(10) Patent No.: US 9,241,404 B2
(45) Date of Patent: Jan. 19, 2016

(54) ADHESIVE VARNISH, ADHESIVE FILM AND WIRING FILM

(71) Applicant: Hitachi Metals, Ltd., Tokyo (JP)

(72) Inventors: Daisuke Shanai, Hitachi (JP); Takashi Aoyama, Hitachi (JP); Kazuhiko Sasada, Saitama (JP); Hiroaki Komatsu, Hitachi (JP)

(73) Assignee: HITACHI METALS, LTD., Tokyo (JP)

( * ) Notice: Subject to any disclaimer, the term of this patent is extended or adjusted under 35 U.S.C. 154(b) by 86 days.

(21) Appl. No.: 14/158,252

(22) Filed: Jan. 17, 2014

(65) Prior Publication Data

US 2014/0202737 A1    Jul. 24, 2014

(30) Foreign Application Priority Data

Jan. 22, 2013  (JP) ................. 2013-009282

(51) Int. Cl.

| C09J 175/08 | (2006.01) |
|---|---|
| C09J 7/02 | (2006.01) |
| H05K 1/02 | (2006.01) |
| C08G 18/48 | (2006.01) |

(Continued)

(52) U.S. Cl.
CPC .......... H05K 1/0298 (2013.01); C08G 18/0852 (2013.01); C08G 18/4879 (2013.01); C08G 18/8116 (2013.01); C09J 7/0242 (2013.01); C09J 175/16 (2013.01); H05K 3/386 (2013.01); C09J 2203/326 (2013.01); C09J 2475/00 (2013.01); C09J 2479/086 (2013.01); H05K 2201/0154 (2013.01); Y10T 428/24959 (2015.01); Y10T 428/2852 (2015.01)

(58) Field of Classification Search
CPC ........... C08G 18/0852; C08G 18/4879; C08G 18/8116; C09J 7/0242; C09J 175/08; C09J 175/16; C09J 2203/326; C09J 2475/00; C09J 2479/086; Y10T 428/2852; Y10T 428/24959; H05K 1/0298; H05K 3/386; H05K 2201/0154
USPC ............. 428/355 EP, 355 N, 214; 174/137 R; 524/540, 360
See application file for complete search history.

(56) References Cited

U.S. PATENT DOCUMENTS 4,401,499 A * 8/1983 Kaneko et al. ............. 156/307.3
5,523,137 A    6/1996 Sei et al.

(Continued)

FOREIGN PATENT DOCUMENTS

| JP | H05-029399 | 2/1993 |
|---|---|---|
| JP | 2001-262111 | 9/2001 |

(Continued)

Primary Examiner — Thao T Tran
(74) Attorney, Agent, or Firm — Roberts Mlotkowski Safran & Cole P.C.

(57) ABSTRACT

An adhesive varnish includes 100 parts by mass of a component A that includes a phenoxy resin including a plurality of hydroxyl groups in a side chain, 2 to 55 parts by mass of a component B that includes a polyfunctional isocyanate compound including, in a molecule thereof, an isocyanate and at least one of a vinyl group, an acrylate group and a methacrylate group, 5 to 30 parts by mass of a component C that includes a maleimide compound including a plurality of maleimide groups in a molecule thereof or/and a reaction product thereof, a component S1 including a low-boiling point solvent having a boiling point of not more than 100° C., and a component S2 including a high-boiling point solvent having a boiling point of more than 100° C.

13 Claims, 5 Drawing Sheets

(51) Int. Cl.
*C08G 18/81* (2006.01)
*C08G 18/08* (2006.01)
*C09J 175/16* (2006.01)
*H05K 3/38* (2006.01)

(56) References Cited

U.S. PATENT DOCUMENTS

| 5,843,550 | A | 12/1998 | Sei et al. |
| 5,945,188 | A | 8/1999 | Sei et al. |
| 9,028,970 | B2 * | 5/2015 | Amou et al. ............... 428/473.5 |
| 2005/0187311 | A1 * | 8/2005 | Nakamura .................... 522/173 |
| 2009/0214876 | A1 * | 8/2009 | Kano et al. .................. 428/423.1 |
| 2014/0158413 | A1 * | 6/2014 | Shanai et al. ................. 174/257 |

FOREIGN PATENT DOCUMENTS

| JP | 2004-136631 | 5/2004 |
| JP | 2008-258607 | 10/2008 |
| JP | 2010-143988 | 7/2010 |
| JP | 2010-150437 | 7/2010 |

* cited by examiner

ADHESIVE VARNISH, ADHESIVE FILM AND WIRING FILM

The present application is based on Japanese patent application No. 2013-009282 filed on Jan. 22, 2013, the entire contents of which are incorporated herein by reference.

BACKGROUND OF THE INVENTION

1. Field of the Invention

The invention relates to an adhesive varnish, an adhesive film and a wiring film. In particularly, the invention relates to an adhesive varnish that, when being used as an adhesive etc., can provide excellent storage stability, adhesive properties and heat resistance and moisture-resistance reliability after the adhesion. Also, the invention relates to an adhesive varnish that, when being used as an adhesive film or a wiring film, can prevent the foam formation and curling during the drying.

2. Description of the Related Art

In recent years, electric/electronic devices have become smaller to save space and lighter and internal wiring materials used therein are required to be fine and thin wirings to realize high density wiring. In addition, in order to reduce use of substances of concern, it has been progressively switched from conventional lead solder to lead-free solder. Accordingly, internal wiring materials are required to have improved heat resistance.

An insulation layer of the wiring member mentioned above is basically composed of a base film and an adhesive film (see, e.g., JP-A-H05-029399). Organic insulating films using heat-resistant films of polyimide, polyetherimide, polyphenylene sulfide or polyether ether ketone, etc., and heat-resistant composite films of epoxy resin-glass cloth or epoxy resin-polyimide-glass cloth, etc., are described as examples of the base film. For the adhesive layer, an adhesive containing a polyamide resin and an epoxy resin is disclosed.

However, the adhesive described in JP-A-H05-029399 has a problem that storage stability is poor due to high reactivity of an amino group present in a polyamide resin structure with the epoxy resin. In order to solve this problem, an adhesive composed of a phenoxy resin having epoxy groups at both terminals, acrylic rubber and a curing agent has been proposed (see, e.g., JP-A-2004-136631). The phenoxy resins of bisphenol A-type, bisphenol F-type, bisphenol AD-type, bisphenol S-type and copolymerization type having bisphenol A-type and bisphenol F-type are described as examples. The adhesive described in JP-A-2004-136631 has problems that adhesive strength is only about 0.5 kN/m even though the phenoxy resin considered to be relatively excellent in adhesive strength is blended and also solder heat resistance is as slightly low as 260° C.

An adhesive containing a thermoplastic polyurethane resin having a weight average molecular weight of 80,000 to 800,000, an epoxy resin and an epoxy resin curing agent has been disclosed as a measure of solving the above-mentioned problems (see, e.g., JP-A-2010-150437).

Although typical polyurethane resins have a problem in storage stability of the adhesive film because of high reactivity with epoxy resin, JP-A-2010-150437 describes use of a polyurethane resin having a molecular weight within a specific range to improve storage stability. Adhesive strength is 1.1 to 1.7 kN/m.

Meanwhile, it has been disclosed that an adhesive containing a polyurethane resin, an epoxy resin and a novolac resin having a specific structure has solder heat resistance of 300° C. (see, e.g., JP-A-2010-143988). However, it is known that the polyurethane resins used in JP-A-2010-150437 and JP-A-2010-143988 are generally depolymerized at a temperature of not less than 200° C. Heat resistance of polyurethane is generally 80 to 100° C. and there is therefore concern about use of adhesives containing a polyurethane resin in the industries and the field of automobile electronic devices which require high heat resistance.

An adhesive containing a (meth)acrylic-modified phenoxy resin and an epoxy resin and an adhesive containing a (meth)acrylic-modified phenoxy resin in the same manner, an urethane acrylate oligomer and a silane coupling agent have been also disclosed (see JP-A-2001-262111 and JP-A-2008-258607). The adhesive containing an epoxy resin described in JP-A-2001-262111 is excellent in heat resistance but has a problem that adhesive strength is as low as about 0.6 kN/m. Meanwhile, the adhesive containing a urethane acrylate and a silane coupling agent described in JP-A-2008-258607 is excellent in adhesion with metal conductors but there is lack of consideration of adhesion with polyimide films which are high heat-resistant base films.

Furthermore, for handling the adhesive film, it is important that curling is as small as possible and no tuck is present.

SUMMARY OF THE INVENTION

It is an object of the invention to provide an adhesive varnish that, when being used as an adhesive etc., can provide excellent storage stability, adhesive properties and heat resistance and moisture-resistance reliability after the adhesion, and that, when being used as an adhesive film or a wiring film, can prevent the foam formation and curling during the drying. It is another object of the invention to provide an adhesive film and a wiring film using the adhesive varnish.

(1) According to one embodiment of the invention, an adhesive varnish comprises:

100 parts by mass of a component A that comprises a phenoxy resin comprising a plurality of hydroxyl groups in a side chain;

2 to 55 parts by mass of a component B that comprises a polyfunctional isocyanate compound comprising, in a molecule thereof, an isocyanate and at least one of a vinyl group, an acrylate group and a methacrylate group;

5 to 30 parts by mass of a component C that comprises a maleimide compound comprising a plurality of maleimide groups in a molecule thereof or/and a reaction product thereof;

a component S1 comprising a low-boiling point solvent having a boiling point of not more than 100° C.; and a component S2 comprising a high-boiling point solvent having a boiling point of more than 100° C.

In the above embodiment (1) of the invention, the following modifications and changes can be made.

(i) A mixture ratio of the low-boiling-point solvent constituting the component S1 to the high-boiling-point solvent constituting the component S2 is 97:3 to 75:25.

(ii) The component S1 comprises a methyl ethyl ketone and wherein the component S2 comprises a cyclohexanone.

(iii) The adhesive varnish further comprises: 0.001 to 0.1 parts by mass of a component D comprising an urethanization catalyst; and 0.0002 to 1 part by mass of a component E comprising a radical polymerization inhibitor, wherein a total amount of the component B and the component C is 7 to 60 parts by mass.

(iv) The phenoxy resin constituting the component A has a weight average molecular weight of 40,000 to 100,000 in terms of styrene.

(2) According to another embodiment of the invention, an adhesive film comprises:
a polyimide base material; and
an adhesive layer comprising the adhesive varnish according to the embodiment (1) provided on one or both surfaces of the polyimide base material.

In the above embodiment (2) of the invention, the following modifications and changes can be made.

(v) The adhesive layer is 10 to 100 μm in thickness, and wherein the polyimide base material is 25 to 100 μm in thickness.

(3) According to another embodiment of the invention, a wiring film comprises:
at least two of the adhesive film according to the embodiment (2) arranged so that the adhesive layer faces each other; and
a conductor wiring arranged between the two of the adhesive film,
wherein the adhesive layer is fusion-bonded.

(4) According to another embodiment of the invention, a wiring film comprises:
a double-sided adhesive film comprising the adhesive film according to the embodiment (2) comprising the adhesive layer on both surfaces of the polyimide base material;
two single-sided adhesive films comprising the adhesive film comprising the adhesive layer on one surface and arranged on both sides of the double-sided adhesive film so that the adhesive layer faces each other; and
a conductor wiring arranged sandwiched between the two single-sided adhesive films and the double-sided adhesive film,
wherein the adhesive layer is fusion-bonded.

In the above embodiment (3) or (4) of the invention, the following modifications and changes can be made.

(vi) The conductor wiring is 35 to 500 μm in thickness.

Effects of the Invention

According to one embodiment of the invention, an adhesive varnish can be provided that, when being used as an adhesive etc., can provide excellent storage stability, adhesive properties and heat resistance and moisture-resistance reliability after the adhesion, and that, when being used as an adhesive film or a wiring film, can prevent the foam formation and curling during the drying. Also, according to another embodiment of the invention, an adhesive film and a wiring film using the adhesive varnish can be provided.

BRIEF DESCRIPTION OF THE DRAWINGS

Next, the present invention will be explained in more detail in conjunction with appended drawings, wherein.

DETAILED DESCRIPTION OF THE PREFERRED EMBODIMENTS

Figure 1:
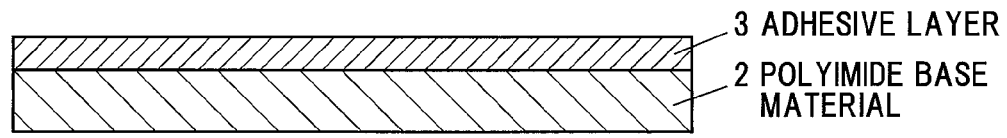
FIG. 1 is a schematic cross sectional view showing an adhesive film in a second embodiment of the present invention.

Embodiments of the invention will be described below in reference to the drawings. It should be noted that constituent elements having substantially the same functions are denoted by the same reference numerals in each drawing and the overlapping explanation thereof will be omitted.

Summary of the Embodiment

An adhesive varnish in the embodiment contains the following components A, B and C in the following blending amount and also contains the following components S1 and S2 as a solvent component:

A: 100 parts by mass of phenoxy resin containing plural hydroxyl groups in a side chain B: 2 to 55 parts by mass of polyfunctional isocyanate compound having, in a molecule, an isocyanate and at least one functional group selected from the group consisting of a vinyl group, an acrylate group and a methacrylate group C: 5 to 30 parts by mass of a maleimide compound having plural maleimide groups in a molecule or/and a reaction product thereof S1: Low-boiling-point solvent having a boiling point of not more than 100° C.

S2: High-boiling-point solvent having a boiling point of more than 100° C.

Meanwhile, an adhesive film in the embodiments has an adhesive layer(s) which is prepared from the above-mentioned adhesive varnish and is provided on one or both surfaces of a polyimide base material.

In addition, a wiring film in the embodiment is manufactured by arranging the above-mentioned adhesive films so that the adhesive layers face each other, arranging a conductor wiring so as to be sandwiched therebetween and then fusion-bonding the adhesive layers. In addition, a wiring film in the embodiment is manufactured by arranging the above-mentioned adhesive films each having the adhesive layer on one surface of the polyimide base material (single-sided adhesive films) on both sides of the above-mentioned adhesive film having the adhesive layers on both surfaces (double-sided adhesive film) so that the adhesive layers face each other, then arranging conductor wirings so as to be respectively sandwiched between the single-sided adhesive films and the double-sided adhesive film, and then fusion-bonding the adhesive layers.

First Embodiment

An adhesive varnish in the first embodiment of the invention contains the following components A, B and C in the following blending amount and also contains the following components S1 and S2 as a solvent component:

A: 100 parts by mass of phenoxy resin containing plural hydroxyl groups in a side chain B : 2 to 55 parts by mass of polyfunctional isocyanate compound having, in a molecule, an isocyanate and at least one functional group selected from the group consisting of a vinyl group, an acrylate group and a methacrylate group C: 5 to 30 parts by mass of a maleimide compound having plural maleimide groups in a molecule or/and a reaction product thereof S1 Low-boiling-point solvent having a boiling point of not more than 100° C.

S2: High-boiling-point solvent having a boiling point of more than 100° C.

(1) Component A: Phenoxy Resin

The component A used for the adhesive varnish in the first embodiment is a phenoxy resin containing plural hydroxyl groups in a side chain. The component A is used as a base resin. Therefore, a phenoxy resin having a 5% thermal weight-loss temperature of more than 350° C. is used so as to allow the adhesive varnish to be used to form an adhesive excellent in storage stability as well as heat resistance and moisture-resistance reliability after adhesion.

The phenoxy resin constituting the component A has functions of imparting film-forming properties to adhesives when the adhesive varnish is used for adhesives and imparting flexibility and mechanical strength to an adhesive layer when used for, e.g., adhesive films, etc.

As a molecular weight range to exert such functions, a weight average molecular weight (hereinafter, sometimes referred to as weight average molecular weight expressed in terms of styrene) measured by a gel permeation chromatography (GPC) method is generally 20,000 to 100,000 (in terms of styrene). The weight average molecular weight is preferably 40,000 to 100,000 in terms of styrene from the viewpoint of improvement in retention of adhesive strength of hardened materials and mechanical strength of adhesive layers in adhesive films, etc.

Examples of bisphenol A-type phenoxy resin include YP-55U, YP-50 and YP-50S (trade names), etc., manufactured by Nippon Steel & Sumikin Chemical Co., Ltd.

Note that, it is possible to significantly reduce the time required for manufacturing the adhesive varnish by using adhesive varnishes in which a phenoxy resin is preliminarily dissolved in MEK. One of such commercially available adhesive varnishes is YP-50EK35 manufactured by Nippon Steel & Sumikin Chemical Co., Ltd.

(2) Component B: Polyfunctional Isocyanate Compound

The component B used for the adhesive varnish in the first embodiment is constructed from a polyfunctional isocyanate compound having, in a molecule, an isocyanate and at least one functional group selected from the group consisting of a vinyl group, an acrylate group and a methacrylate group.

A polyfunctional isocyanate compound having, in a molecule, an isocyanate group and also a vinyl group, an acrylate group and a methacrylate group having reactivity different from the isocyanate group is used as the component B. For example, in case of using the adhesive varnish ultimately for wiring films, etc., the isocyanate group reacts with hydroxyl groups in a side chain of the phenoxy resin, which enhances solubility of the phenoxy resin into a solvent component and increases adhesive strength of the phenoxy resin of the component A with a conductor, and also imparts radical polymerizability, i.e., crosslinking properties, to the phenoxy resin. In case of using the adhesive varnish for adhesives, the vinyl, acrylate and methacrylate groups improve heat resistance, etc., of the adhesives. In other words, the polyfunctional isocyanate compound constituting the component B has functions of enhancing solubility of the phenoxy resin into an all-purpose solvent, imparting radical polymerizability (crosslinking properties) to the phenoxy resin, and improving heat resistance, etc., of the adhesives. The polyfunctional isocyanate compound may have an alkoxysilyl group.

Examples of the polyfunctional isocyanate compound constituting the component B include vinyl isocyanate, butyl isocyanate, hexyl isocyanate, octadecyl isocyanate, cyclohexyl isocyanate, phenyl isocyanate, methacryl isocyanate, 4-methylbenzyl isocyanate, 2-acryloyloxyethyl isocyanate, 2-methacryloyloxyethyl isocyanate, 1,1-bis(acryloxymethyl)-ethyl isocyanate and 3-isocyanate propyltrimethoxysilane.

In more detail, vinyl isocyanate (manufactured by Sigma-Aldrich Japan K.K.), 2-methacryloyloxyethyl isocyanate (trade name: Karenz®MOI, manufactured by Showa Denko K.K.), 2-acryloyloxyethyl isocyanate (trade name: Karenz®AOI, manufactured by Showa Denko K.K.) and 1,1-bis(acryloxymethyl)-ethyl isocyanate (trade name: KarenzBEI®, manufactured by Showa Denko K.K.), etc., can be used.

The polyfunctional isocyanate compound constituting the component B is blended in an amount of 2 to 55 parts by mass per 100 parts by mass of the phenoxy resin constituting the component A. When the polyfunctional isocyanate compound is less than 2 parts by mass, solubility of the phenoxy resin is reduced, resulting in non-uniform varnish. When the adhesive varnish is used for adhesives, more than 55 parts by mass of the polyfunctional isocyanate compound causes a decrease in adhesive strength of the adhesives.

In the adhesive varnish of the first embodiment, the total amount of the polyfunctional isocyanate compound constituting the component B and the below-described maleimide compound constituting the component C is preferably within a range of 7 to 60 parts by mass. A desired effect is not obtained when less than 7 parts by mass, while flexibility may be impaired due to excessive crosslinking when more than 60 parts by mass.

(3) Component C: Maleimide Compound or/and Reaction Product Thereof

The component C used for the adhesive varnish in the first embodiment is constructed from a maleimide compound having plural maleimide groups in a molecule or/and a reaction product thereof.

As for the component C, a maleimide compound having plural maleimide groups in a molecule or/and a reaction product thereof is/are used as a cross-linking agent exhibiting high adhesion to improve adhesion between a resin component in the adhesive varnish and a polyimide film as a base film when the adhesive varnish is used for, e.g., adhesive films or wiring films, etc. In more detail, the maleimide compound having plural maleimide groups in the structure thereof is a component which reacts with hydroxyl groups in the phenoxy resin constituting the component A and with an unsaturated double bond-containing group introduced into the phenoxy resin and imparts hardenability and adhesive properties to the system, and thereby has a function of improving heat resistance, moisture-resistance reliability, adhesive properties and chemical resistance of the cured adhesive layer.

Examples of the maleimide compound constituting the component C include BMI-1000, BMI-2000, BMI-5000, BMI-5100 and BMI-TMH (trade names), etc., manufactured by Daiwa Kasei Industry Co., Ltd.

The maleimide compound constituting the component C is blended in an amount of 5 to 30 parts by mass per 100 parts by mass of the phenoxy resin constituting the component A. Heat resistance is reduced when less than 5 parts by mass, while adhesive strength tends to decrease when more than 30 parts by mass.

(4) Component S1: Low-Boiling-Point Solvent and Component S2: High-Boiling-Point Solvent The solvent component used for the adhesive varnish in the first embodiment is composed of a low-boiling-point solvent having a boiling point of not more than 100° C. as the component S1 and a high-boiling-point solvent having a boiling point of more than 100° C. as the component S2. Mixing the low-boiling-point solvent as the component S1 and the high-boiling-point solvent as the component S2 allows foam formation and curling during drying to be suppressed in the final product of adhesive films, etc., as described above.

That is, an adhesive varnish having a solid content concentration of more than 35 parts by mass can be made by dissolving the above-mentioned resin component into, e.g., methyl ethyl ketone. In this regard, however, when the adhesive varnish formed using a solvent having a boiling point as low as that of methyl ethyl ketone is wet-coated by a coater to form an adhesive layer having a dry film thickness of more than 40 μm, a skin is formed because the surface is initially dried and air bubbles are then generated when the solvent located inside is dried, which results in poor appearance. On the other hand, when the adhesive varnish is made only using a high-boiling-point solvent having a boiling point of more than 110° C. and is wet-coated by a coater to form an adhesive film, foam formation during drying can be prevented but the film curls up largely. Thus, in the first embodiment, the mixture of the low-boiling-point solvent as the component S1 and the high-boiling-point solvent as the component S2 is used.

om the above-mentioned viewpoint, the low-boiling-point solvent as the component S1 and the high-boiling-point solvent as the component S2 which are used for the adhesive varnish in the first embodiment are preferably mixed at a ratio in a range of 97:3 to 75:25, more preferably, 95:5 to 80:20.

For the adhesive varnish in the first embodiment, the low-boiling-point solvent as the component S1 is preferably methyl ethyl ketone as an all-purpose solvent having a boiling point of about 80° C. and the high-boiling-point solvent as the component S2 is preferably cyclohexanone having a boiling point of 156° C.

When methyl ethyl ketone is used as the component S1, a drying process is performed at about 100° C. Although, for this reason, the boiling point of the high-boiling-point solvent to be added is preferably higher than 100° C., if a solvent having poor compatibility with the phenoxy resin as the component A is added, the phenoxy resin is precipitated and it is thus not possible to manufacture stable adhesive varnishes. Therefore, cyclohexanone having a high boiling point and high compatibility with the phenoxy resin is preferable as the component S2.

Methyl ethyl ketone is a solvent having a boiling point of about 80° C. as described above. Such methyl ethyl ketone with the phenoxy resin added thereto is heated in a temperature range lower than the boiling point thereof and is stirred for several hours to dissolve the phenoxy resin, thereby making the adhesive varnish. Note that, adhesive varnishes in which the phenoxy resin is dissolved in methyl ethyl ketone are commercially available and are easily obtained.

The adhesive varnish adjusted to the above range is applied to the polyimide base material by a coater and is dried at, e.g., 90° C. to 130° C. which is lower than the boiling point of cyclohexanone, thereby making an adhesive film in which foam formation and curling are suppressed at the same time.

The adhesive film formed of the adhesive varnish in the first embodiment is free from foaming and is less likely to curl up, and has good handling properties. In addition, a wiring film as an end product has all of heat resistance, moisture-resistance reliability and high adhesive properties. The adhesive varnish in the first embodiment is also excellent in thick film-coatability and is suitably used for a high heat-resistant adhesive film in which curling is suppressed.

(5) Component D: Urethanization Catalyst

The component D used, if necessary, for the adhesive varnish in the first embodiment is constructed from an urethanization catalyst. The urethanization catalyst constituting the component D has a function of promoting the formation of urethane bonds between the polyfunctional isocyanate compound constituting the component B and the phenoxy resin constituting the component A.

Examples of the urethanization catalyst constituting the component D include metal salts such as dibutyltin dilaurate and tertiary amines such as triethylamine and N,N-dimethylcyclohexylamine, etc.

The urethanization catalyst constituting the component D is preferably blended in an amount of 0.001 to 0.1 parts by mass per 100 parts by mass of the phenoxy resin constituting the component A. A small amount has no effect, while bleed out occurs with an excess amount, which may cause a decrease in adhesive strength.

(6) Component E: Radical Polymerization Inhibitor

The component E used, if necessary, for the adhesive varnish in the first embodiment is constructed from a radical polymerization inhibitor. The radical polymerization inhibitor constituting the component E has functions of suppressing unwanted radical polymerization reaction during storage, etc., of adhesive varnishes, adhesives and adhesive films. The radical polymerization inhibitor has a function of ultimately preventing oxidation of the adhesive layer and also a function contributing to improvement in thermal stability of a wiring film.

Examples of the radical polymerization inhibitor constituting the component E include phenols such as tert-butylhydroquinone, 2-t-butyl-4-methylphenol, 2,6-di-t-butyl-4-methylphenol and t-butyl-pyrocatechol.

The radical polymerization inhibitor constituting the component E is preferably blended in an amount of 0.0002 to 1 part by mass per 100 parts by mass of the phenoxy resin constituting the component A. A small amount has no effect, while bleed out occurs with an excess amount, which may cause a decrease in adhesive strength.

(7) Other Components: Radical Polymerization Initiator and Silane Coupling Agent, etc.

The adhesive varnish in the first embodiment can contain a radical polymerization initiator, if necessary. The radical polymerization initiator has a function of promoting cross-linking reaction of a reaction product produced by reaction of the maleimide compound constituting the component C with the polyfunctional isocyanate compound constituting the component B and the phenoxy resin constituting the component A. In addition, the radical polymerization initiator promotes curing reaction of the adhesive film after adhesion and thus can improve adhesive strength and heat resistance of the wiring film as an end product.

Various organic peroxides having a one-hour half-life temperature of 80° C. to 120° C. are preferable as the radical polymerization initiator. In more detail, Perhexa C, Perhexa V and Perhexine 25B (trade names), etc., manufactured by NOF Corporation can be used.

The blended amount thereof is preferably 0.03 to 1 part by mass. A small amount has no effect, while cross-linking reaction is excessively accelerated with an excess amount, which may cause a decrease in adhesive strength.

The adhesive varnish in the first embodiment can also contain a silane coupling agent, etc., if necessary. For example, an isocyanate silane compound enhances solubility of the phenoxy resin into a solvent by reacting with hydroxyl groups in the side chain of the phenoxy resin and introduces a silanol group or/and an alkoxysilane group into a side chain of the phenoxy resin, and thus has a function contributing to improvement in heat resistance resulting from cross-linking between the alkoxysilane group or/and the silanol group and to improvement in solubility. In addition, when used for wiring films, chemical bond with metal, metal oxide or metal hydroxide on the conductor wiring contributes to improvement in adhesion with the conductive wire. Examples of such compounds include 3-(triethoxysilyl)propyl isocyanate.

The blended amount of the silane coupling agent is preferably 0.01 to 10 parts by mass. A small amount has no effect, while cross-linking reaction is excessively accelerated with an excess amount, which may cause a decrease in adhesive strength.

The adhesive varnish in the first embodiment can provide, in case of used for, e.g., adhesive, excellent storage stability and adhesive properties as well as heat resistance and moisture-resistance reliability in an adherent state and can suppress foam formation and curling during drying when used for adhesive films and wiring films.

Second Embodiment

FIG. 1 is a schematic cross sectional view showing an adhesive film in the second embodiment of the invention. As shown in FIG. 1, an adhesive film 1 in the second embodiment is configured such that an adhesive layer 3 prepared from the adhesive varnish is provided on a surface of a polyimide base material 2. This adhesive film 1 is sometimes referred to as a single-sided adhesive film.

For the adhesive film 1 in the second embodiment, the polyimide base material 2 excellent in heat resistance is used as a base material.

As the polyimide base material 2, it is preferable to use a polyimide film having a breaking elongation at 25° C. of not less than 75%. Since use of a highly flexible polyimide film as the polyimide base material 2 allows adhesive between the adhesive and the polyimide base material 2 to be increased without surface modification of the polyimide base material 2 and breakage of the adhesive film to be suppressed, it is possible to enhance adhesion reliability of a wiring film as an end product. Examples of such a polyimide film include Kapton® 100V, 200V, 100H and 200H (trade names) manufactured by Du Pont-Toray Co., Ltd., and Apical® 25NPI (trade name) manufactured by Kaneka Corporation, etc.

The thickness of the polyimide base material 2 can be appropriately selected depending on the purpose and is preferably selected in a range of 25 to 100 μm from the viewpoint of productivity and handling properties of the adhesive film and the wiring film.

The adhesive layer 3 is prepared from the adhesive varnish described above. The thickness of the adhesive layer 3 is preferably selected in a range of 10 to 100 μm from the viewpoint of productivity and handling properties of the adhesive film and the wiring film. In detail, in case of manufacturing, e.g., a wiring film, it is possible to obtain satisfactory wiring embedding properties by appropriately selecting the thickness of the adhesive layer 3 within the above-mentioned range according to the thickness of a conductor wiring 4.

Third embodiment

Figure 2:
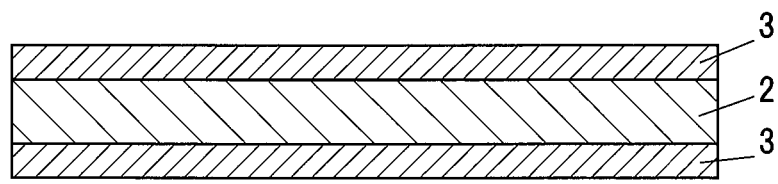
FIG. 2 is a schematic cross sectional view showing an adhesive film in a third embodiment of the invention.

FIG. 2 is a schematic cross sectional view showing an adhesive film in the third embodiment of the invention. As shown in FIG. 2, the adhesive film 1 in the third embodiment is configured such that the adhesive layers 3 prepared from the adhesive varnish are provided on both surfaces of the polyimide base material 2. This adhesive film 1 is sometimes referred to as a double-sided adhesive film.

Fourth Embodiment

Figure 3:
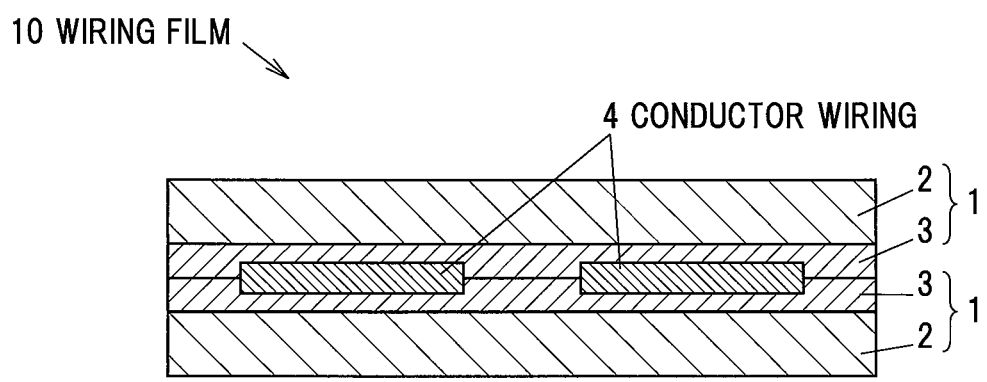
FIG. 3 is a schematic cross sectional view showing a wiring film in a fourth embodiment of the invention.

FIG. 3 is a schematic cross sectional view showing a wiring film in the fourth embodiment of the invention. As shown in FIG. 3, a wiring film 10 in the fourth embodiment is manufactured as follows: the adhesive films 1 shown in FIG. 1 are arranged so that the adhesive layers 3 face each other, the conductor wiring 4 is arranged so as to be sandwiched therebetween and the adhesive layers 3 are fusion-bonded.

The thickness of the conductor wiring 4 is preferably in a range of 35 to 500 μm in order to ensure handling properties of the conductor wiring 4 at the time of placing the conductor wiring 4 on the adhesive film 1.

Plural conductor wirings 4 may be arranged on the same surface.

For the wiring film 10 in the fourth embodiment, the adhesive layers 3 are preferably fusion-bonded at a fusing temperature of not more than 160° C. and fusing pressure of not more than 3 MPa, more preferably, not more than 1 MPa from the viewpoint of productivity, etc.

In order to increase adhesion between the conductor wiring 4 and the adhesive films 1, the adhesive layers 3 of the adhesive films 1 are preferably post-heated at not less than the fusing temperature thereof. The post-heating is performed at a post-curing temperature of, e.g., 180 to 220° C. for 30 to 60 minutes. The post-curing can be performed while applying pressure to the wiring film 10 or without applying pressure.

It is preferable that the conductor wiring 4 be a copper wiring from the viewpoint of high conductivity.

In addition, in the wiring film 10 of the fourth embodiment, at least a portion of the outer layer of the copper wiring is preferably covered with at least one layer selected from the group consisting of metal layers, metal oxide layers and metal hydroxide layers which contain at least one element selected from the group consisting of tin, nickel, zinc and cobalt. This suppresses oxidation of the copper wiring, which allows adhesive properties to be improved.

Furthermore, in the wiring film 10 of the fourth embodiment, at least a portion of the outer layer of the conductor wiring 4 is preferably covered with a silane coupling agent containing at least one functional group selected from the group consisting of amino groups, vinyl groups, styryl groups, acrylate groups and methacrylate groups. This allows adhesion reliability between the conductor wiring 4 and the adhesive layer 3 to be improved.

Such silane coupling agents form a primary bond with a vinyl group, an acrylate group or a methacrylate group introduced into the phenoxy resin constituting the component A or the maleimide compound constituting the component C, and thus have a function contributing to improvement in adhesive properties, heat resistance and moisture-resistance reliability of the wiring film.

Examples of the silane coupling agent include commercially available silane coupling agents such as vinyltrimethoxysilane, vinyltriethoxysilane, 3-methacryloxypropylmethyldimethoxysilane, 3-methacryloxypropyltrimethoxysilane, 3-acryloxypropyltrimethoxysilane and p-styryltrimethoxysilane.

For surface treatment with the silane coupling agent, it is preferable that a 0.5 to 8 mass % aqueous solution or organic solvent solution of silane coupling agent be applied to the conductor wiring 4, followed by drying at 100 to 150° C. for 10 to 30 minutes.

Fifth Embodiment

Figure 4:
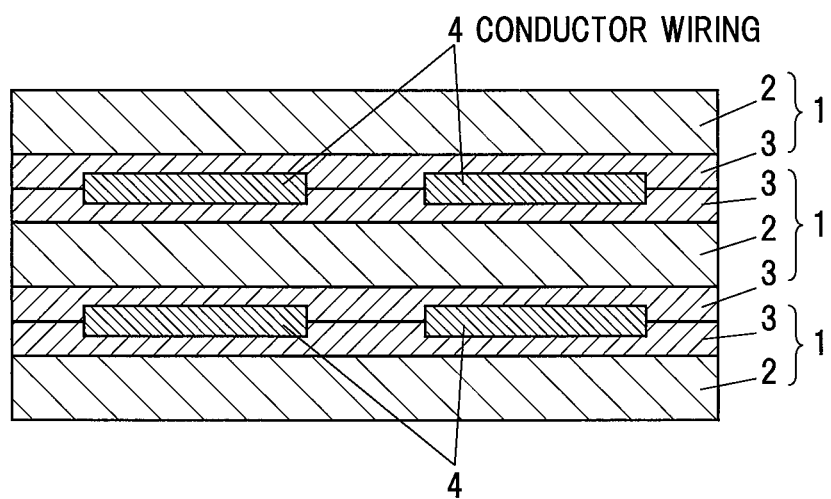
FIG. 4 is a schematic cross sectional view showing a wiring film in a fifth embodiment of the invention.

FIG. 4 is a schematic cross sectional view showing a wiring film in the fifth embodiment of the invention. As shown in FIG. 4, the wiring film 10 in the fifth embodiment is manufactured as follows: the single-sided adhesive films, which are one type of the adhesive film 1 and each have the adhesive layer 3 on one surface of the polyimide base material 2, are arranged on both sides of the double-sided adhesive film having the adhesive layers 3 on both surfaces so that the adhesive layers 3 face each other, the conductor wirings 4 are arranged so as to be respectively sandwiched between the two single-sided adhesive films and the double-sided adhesive film, and the adhesive layers 3 are then fusion-bonded.

EXAMPLES

The adhesive film 1 and the wiring film 10 in the embodiments will be described in more detail below in reference to Examples. It should be noted that Examples are not intended to limit the invention in any way.

Example 1

(1) Preparation of Adhesive Varnish

Firstly, a bisphenol A-type phenoxy resin (trade name: YP-50 manufactured by Nippon Steel & Sumikin Chemical Co., Ltd.; weight average molecular weight: 73,000 in terms of styrene) used as the phenoxy resin constituting the component A was dissolved in a mixture solvent of methyl ethyl ketone and cyclohexanone, thereby preparing varnish of 25 mass %. Next, the following components were dissolved and blended in a mixture solvent composed of 270 parts by mass of methyl ethyl ketone (MEK) and 30 parts by mass of cyclohexanone to prepare an adhesive varnish: 100 parts by mass of the phenoxy resin constituting the component A; 15 parts by mass of 2-methacryloyloxyethyl isocyanate (trade name: Karenz®MO, manufactured by Showa Denko K.K.) as the polyfunctional isocyanate compound constituting the component B; 20 parts by mass of bismaleimide (trade name: BMI-2300, manufactured by Daiwa Kasei Industry Co., Ltd.) as the maleimide compound constituting the component C; 0.009 parts by mass (1 part by mass with respect to the solution mixed with the MRK solvent) of dibutyltin dilaurate (trade name: DBTDL, manufactured by Wako Pure Chemical Industries, Ltd.) as the urethanization catalyst constituting the component D; and 0.0045 parts by mass (1 part by mass with respect to the solution mixed with the MRK solvent) of dibutylhydroxytoluene (trade name: BHT, manufactured by Wako Pure Chemical Industries, Ltd.) as the radical polymerization inhibitor constituting the component E.

(2) Manufacture of Adhesive Film

The obtained adhesive varnish was applied to the polyimide base material 2 using an applicator with a predetermined gap and was dried at 80° C. for 10 minutes and subsequently at 100 to 160° C. for 5 minutes, thereby making the adhesive film 1. The film thickness of the adhesive layer 3 formed on the polyimide base material was adjusted to 50 μm. A polyimide film (trade name: Kapton® 100V, manufactured by Du Pont-Toray Co., Ltd.) was used as the polyimide base material.

Examples 2 to 12

The adhesive films 1 were made in the same manner as the Example 1 except that each composition of the adhesive varnish was different as shown in Table 1.

TABLE 1

| | | | | | Composition | | | | | |
|---|---|---|---|---|---|---|---|---|---|---|
| | Items | | | | Ex. 1 | Ex. 2 | Ex. 3 | Ex. 4 | Ex. 5 | Ex. 6 |
| Proportion (parts by mass) | (A) Phenoxy resin varnish | YP-50, Nippon Steel | Bisphenol A-type | Mw: 73,000 | 100 | 100 | 100 | 100 | 100 | 100 |
| | (B) Polyfunctional isocyanate | KarenzMOI, Showa Denko | Methacryl isocyanate | — | 15 | 15 | 15 | 10 | 5 | 20 |
| | (D) Urethanization catalyst | DBTDL, Wako Pure Chemical | Dibutyltin dilaurate | — | 0.009 | 0.009 | 0.009 | 0.006 | 0.003 | 0.012 |
| | (E) Polymerization inhibitor | BHT, Wako Pure Chemical | Dibutylhydroxytoluene | — | 0.0045 | 0.0045 | 0.0045 | 0.003 | 0.002 | 0.006 |
| | (C) maleimide | BMI-5100, Daiwa Kasei | Bis-maleimide | — | — | — | — | 20 | 20 | 20 |
| | | BMI-2300, Daiwa Kasei | Bis-maleimide | — | 20 | 20 | 20 | — | — | — |
| | | BMI-1000, Daiwa Kasei | Bis-maleimide | — | — | — | — | — | — | — |
| | Solvent | (S1) MEK | Methyl ethyl ketone | b.p. about 80° C. | 270 | 295 | 200 | 280 | 280 | 280 |
| | | (S2) Cyclohexanone | Cyclohexanone | b.p. about 156° C. | 30 | 5 | 100 | 20 | 20 | 20 |
| Characteristics Evaluation | Foam formation | | No foam formation | | ◎ | ○ | ◎ | ◎ | ◎ | ◎ |
| | Curl | | Small curl | | ◎ | ◎ | ○ | ◎ | ◎ | ◎ |
| | Solder heat resistance | | No swelling | | ○ | ○ | ○ | ○ | ○ | ○ |
| | Initial adhesive strength | | Not less than 0.7 N/mm | | ○1.5 | ○1.3 | ○1.2 | ○1.4 | ○0.9 | ○1.5 |
| | Moisture-resistance reliability | | Not less than 0.7 N/mm | | ○1.2 | ○1.0 | ○0.9 | ○1.1 | ○0.7 | ○1.3 |

| | | | | | Composition | | | | | |
|---|---|---|---|---|---|---|---|---|---|---|
| | Items | | | | Ex. 7 | Ex. 8 | Ex. 9 | Ex. 10 | Ex. 11 | Ex. 12 |
| Proportion (parts by mass) | (A) Phenoxy resin varnish | YP-50, Nippon Steel | Bisphenol A-type | Mw: 73,000 | 100 | 100 | 100 | 100 | 100 | 100 |
| | (B) Polyfunctional isocyanate | KarenzMOI, Showa Denko | Methacryl isocyanate | — | 40 | 20 | 20 | 20 | 20 | 20 |

TABLE 1-continued

| | | | | | | | | | | |
|---|---|---|---|---|---|---|---|---|---|---|
| | (D) Urethanization catalyst | DBTDL, Wako Pure Chemical | Dibutyltin dilaurate | — | 0.024 | 0.012 | 0.012 | 0.012 | 0.012 | 0.012 |
| | (E) Polymerization inhibitor | BHT, Wako Pure Chemical | Dibutylhydroxytoluene | — | 0.012 | 0.006 | 0.006 | 0.006 | 0.006 | 0.006 |
| | (C) maleimide | BMI-5100, Daiwa Kasei | Bis-maleimide | — | 20 | — | — | — | — | — |
| | | BMI-2300, Daiwa Kasei | Bis-maleimide | — | — | 10 | 20 | 30 | — | — |
| | | BMI-1000, Daiwa Kasei | Bis-maleimide | — | — | — | — | — | 5 | 10 |
| | Solvent | (S1) MEK | Methyl ethyl ketone | b.p. about 80° C. | 280 | 280 | 280 | 280 | 280 | 280 |
| | | (S2) Cyclo-hexanone | Cyclo-hexanone | b.p. about 156° C. | 20 | 20 | 20 | 20 | 20 | 20 |
| Characteristics Evaluation | Foam formation | | No foam formation | | ◎ | ◎ | ◎ | ◎ | ◎ | ◎ |
| | Curl | | Small curl | | ◎ | ◎ | ◎ | ◎ | ◎ | ◎ |
| | Solder heat resistance | | No swelling | | ○ | ○ | ○ | ○ | ○ | ○ |
| | Initial adhesive strength | | Not less than 0.7 N/mm | | ○1.5 | ○1.2 | ○1.3 | ○1.4 | ○1.0 | ○1.4 |
| | Moisture-resistance reliability | | Not less than 0.7 N/mm | | ○1.4 | ○1.0 | ○1.2 | ○1.1 | ○0.8 | ○1.0 |

Comparative Examples 1 to 6

The adhesive films 1 were made in the same manner as the Example 1 except that each composition of the adhesive varnish was different as shown in Table 2.

was evaluated as "◎ (passed the test)", the film with a trace amount of micro foam to the extent not causing a characteristic problem was evaluated as "○ (also passed)" and the film with a large amount of foam was evaluated as "X (failed)".

TABLE 2

| | | | | | | Composition | | | | | |
|---|---|---|---|---|---|---|---|---|---|---|---|
| | Items | | | | | Comp. Ex. 1 | Comp. Ex. 2 | Comp. Ex. 3 | Comp. Ex. 4 | Comp. Ex. 5 | Comp. Ex. 6 |
| Proportion (parts by mass) | (A) Phenoxy resin | YP-50, Nippon steel | Bisphenol A-type | Mw: 73,000 | | 100 | 100 | 100 | 100 | 100 | 100 |
| | (B) Polyfunctional isocyanate | KarenzMOI, Showa Denko | Methacryl isocyanate | — | | — | — | — | 20 | 20 | 1 | 60 |
| | (D) Urethanization catalyst | DBTDL, Wako Pure Chemical | Dibutyltin dilaurate | — | | — | — | — | 0.012 | 0.012 | 0.0006 | 0.036 |
| | (E) Polymerization inhibitor | BHT, Wako Pure Chemical | Dibutyl-hydroxy-toluene | — | | — | — | — | 0.006 | 0.006 | 0.0003 | 0.018 |
| | (C) maleimide | BMI-5100, Daiwa Kasei | Bismaleimide | — | | — | — | 1 | 41 | 20 | 20 |
| | Solvent | (S1) MEK | Methyl ethyl ketone | b.p. about 80° C. | | 300 | — | 270 | 270 | 270 | 270 |
| | | (S2) Cyclohexanone | Cyclohexanone | b.p. about 156° C. | | — | 300 | 30 | 30 | 30 | 30 |
| Characteristics Evaluation | Foam formation | | No foam formation | | | X | ○ | ◎ | ◎ | ◎ | ◎ |
| | Curl | | Small curl | | | ○ | X | ◎ | ◎ | ◎ | ◎ |
| | Solder heat resistance | | No swelling | | | Not Evaluated | Not Evaluated | X | X | X | X |
| | Initial adhesive strength | | Not less than 0.7 N/mm | | | Not Evaluated | Not Evaluated | ○0.9 | X | X | X |
| | Moisture-resistance reliability | | Not less than 0.7 N/mm | | | Not Evaluated | Not Evaluated | Not Evaluated | Not Evaluated | Not Evaluated | Not Evaluated |

Evaluation Tests

Following properties of the obtained adhesive films 1 were evaluated. Tables 1 and 2 show the evaluation results.

(1) Foam Formation

Figure 5A:
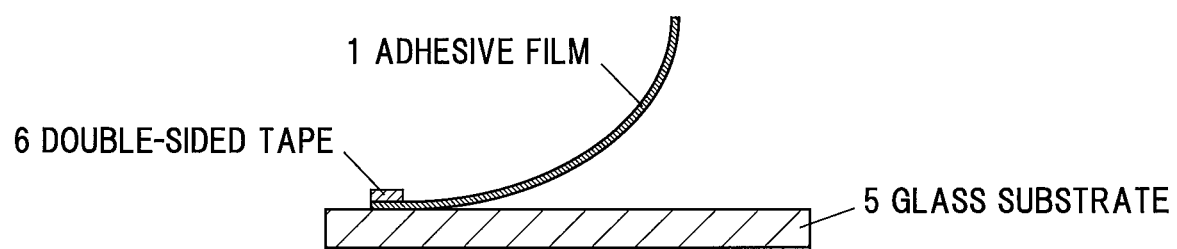
FIG. 5A is a schematic cross sectional view showing a method of evaluating curling of the adhesive film in Examples of the invention.
Figure 5B:
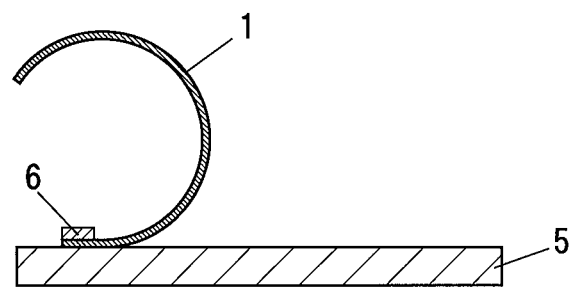
FIG. 5B is a schematic cross sectional view showing a method of evaluating curling of the adhesive film in Examples of the invention.

The surface of the adhesive layer of each obtained adhesive film 1 was visually observed. The film without obvious foam (2) Curling The adhesive film 1 was cut into 2.5 cm×5 cm and presence/absence of curl was visually evaluated. In more detail, the evaluation method shown in FIGS. 5A and 5B was as follows: the adhesive film 1 was cut into 2.5 cm×5 cm and one of the short sides of the adhesive film 1 was fixed to a glass substrate 5 by a double-sided tape 6, as shown in FIGS. 5A and 5B. A width of the fixed portion was 1 mm. Heights (mm)

from the glass substrate to both corners of the warped sample were observed and the average thereof was used as an index of the curling. Particularly small curl was evaluated as "⊚ (passed)". Small curl as shown in FIG. 5A was evaluated as "○ (also passed)". Significant curl (the state in which the free end of the adhesive film 1 goes beyond a perpendicular line on the double-sided tape 6) as shown in FIG. 5B was evaluated as "X (failed)".

(3) Initial Adhesive Strength

A conductor was prepared as follows: a 0.5 μm-thick Ni-plating layer was formed on a surface of a 300 μm-thick oxygen-free copper foil by electroplating. Then, the Ni-plated conductor was cleaned by UV-ozone treatment, was subsequently immersed in a 1% solution of 3-methacryloxypropyltrimethoxysilane for 3 minutes, was taken out and then dried at 110° C. for 10 minutes and was treated with silane, thereby obtaining a conductor. The obtained conductor was placed on the adhesive layer 3 of the adhesive film 1 and was adhered thereto by applying pressure under the conditions of 160° C. and 1 MPa for 10 minutes. The post-heating was further performed in the atmosphere at 180° C. for 60 minutes without applying pressure, thereby obtaining a sample film. The sample film was cut into a 1 cm-wide sample and a 180° peel test was conducted to evaluate adhesion between the conductor and the adhesive film. Peel strength of not less than 0.7 N/mm was evaluated as "○ (passed)", not less than 0.6 N/mm and less than 0.7 N/mm was evaluated as "Δ (failed)" and less than 0.6 N/mm was evaluated as "X (also failed)".

(4) Moisture-Resistance Reliability

The sample for adhesive strength evaluation was left at rest in a constant temperature and humidity environment of 85° C. and humidity of 85% for 100 hours. After that, the 180° peel test was conducted. Peel strength of not less than 0.7 N/mm was evaluated as "○ (passed)", not less than 0.6 N/mm and less than 0.7 N/mm was evaluated as "Δ (failed)" and less than 0.6 N/mm evaluated as "X (also failed)".

(5) Solder Heat Resistance

The conductor was placed on the adhesive layer 3 of the adhesive film 1, was adhered thereto by applying pressure under the conditions of 160° C. and 1 MPa for 10 minutes, and was further heated in the atmosphere at 180° C. for 60 minutes without applying pressure. This sample was floated in a solder bath of 280° C. and was kept for 1 hour. As a result of appearance inspection, the sample without swelling was evaluated as "○ (passed)" and the sample with swelling was evaluated as "X (failed)".

Evaluation Results

Tables 1 and 2 reveal the following points.

Result of Example 1

This is an example in which an appropriate amount of cyclohexanone is added to methyl ethyl ketone. The adhesive film 1 in which foam formation and curling are suppressed was obtained. The wiring film 10 using this adhesive film 1 had good results for both solder heat resistance and moisture-resistance reliability.

Result of Example 2

This is an example in which the amount of cyclohexanone added to methyl ethyl ketone is small. Although a trace amount of micro foam was formed since the amount of cyclohexanone was small, the wiring film 10 using this adhesive film 1 had good results for both solder heat resistance and moisture-resistance reliability.

Result of Example 3

This is an example in which the amount of cyclohexanone added to methyl ethyl ketone is large. Although it was necessary to dry at high temperature (160° C.) and slight curling occurred since the amount of cyclohexanone was large, the wiring film 10 using this adhesive film 1 had good results for both solder heat resistance and moisture-resistance reliability.

Result of Example 4

This is an example in which an appropriate amount of cyclohexanone is added to methyl ethyl ketone. The adhesive film 1 in which foam formation and curling are suppressed was obtained. The wiring film 10 using this adhesive film 1 had good results for both solder heat resistance and moisture-resistance reliability.

Results of Examples 5 to 7

These are examples in which the blended amount of the polyfunctional isocyanate compound constituting the component B is changed from that of Example 4. Regardless of the blending amount, the adhesive films 1 having good appearance without tuck were obtained. The wiring films using thereof had good results for both solder heat resistance and moisture-resistance reliability.

Results of Examples 8 to 12

These are examples in which the type and amount of the maleimide compound constituting the component C are changed from those of Example 4. Regardless of the type and amount of the maleimide compound, good results were obtained for both solder heat resistance and moisture-resistance reliability.

Result of Comparative Example 1

This is an example in which the polyfunctional isocyanate compound constituting the component B, the maleimide compound constituting the component C and cyclohexanone as the component S2 are not contained. A significant amount of foam was formed.

Result of Comparative Example 2

This is an example in which the polyfunctional isocyanate compound constituting the component B, the maleimide compound constituting the component C and methyl ethyl ketone as the component S1 are not contained. It was necessary to dry at high temperature (160° C.) and the film curled up.

Result of Comparative Example 3

This is an example in which the amount of the maleimide compound constituting the component C is not enough. Curing was insufficient and solder heat resistance was not sufficient.

Result of Comparative Example 4

This is an example in which the amount of the maleimide compound constituting the component C is excessive. The film was over-cured and adhesive properties were not sufficient.

Result of Comparative Example 5

This is an example in which the amount of the polyfunctional isocyanate compound constituting the component B is not enough. The amount of isocyanate for imparting adhesive strength was small and adhesive properties were not sufficient.

Result of Comparative Example 6

This is an example in which the amount of the polyfunctional isocyanate compound constituting the component B is excessive. Adhesive properties were not sufficient since isocyanates react with each other.

Although the invention has been described with respect to the specific embodiments for complete and clear disclosure, the appended claims are not to be therefore limited but are to be construed as embodying all modifications and alternative constructions that may occur to one skilled in the art which fairly fall within the basic teaching herein set forth.

What is claimed is:

1. An adhesive varnish, comprising:
   100 parts by mass of a component A that comprises a phenoxy resin comprising a plurality of hydroxyl groups in a side chain;
   2 to 55 parts by mass of a component B consisting of a polyfunctional isocyanate compound selected from the group consisting of vinyl isocyanate, butyl isocyanate, hexyl isocyanate, octadecyl isocyanate, cyclohexyl isocyanate, phenyl isocyanate, methacryl isocyanate, 4-methylbenzyl isocyanate, 2-acryloyloxyethyl isocyanate, 2-methacryloyloxyethyl isocyanate, 1,1-bis(acryloxymethyl)-ethyl isocyanate, and 3-isocyanate propyltrimethoxysilane;
   5 to 30 parts by mass of a component C that comprises a maleimide compound comprising a plurality of maleimide groups in a molecule thereof or/and a reaction product thereof;
   a component S1 comprising a low-boiling point solvent having a boiling point of not more than 100° C.; and
   a component S2 comprising a high-boiling point solvent having a boiling point of more than 100° C.

2. The adhesive varnish according to claim 1, wherein a mixture ratio of the low-boiling-point solvent constituting the component S1 to the high-boiling-point solvent constituting the component S2 is 97:3 to 75:25.

3. The adhesive varnish according to claim 1, wherein the component S1 comprises a methyl ethyl ketone and wherein the component S2 comprises a cyclohexanone.

4. The adhesive varnish according to claim 1, further comprising:
   0.001 to 0.1 parts by mass of a component D comprising an urethanization catalyst; and
   0.0002 to 1 part by mass of a component E comprising a radical polymerization inhibitor,
   wherein a total amount of the component B and the component C is 7 to 60 parts by mass.

5. The adhesive varnish according to claim 1, wherein the phenoxy resin constituting the component A has a weight average molecular weight of 40,000 to 100,000 in terms of styrene.

6. An adhesive film, comprising:
   a polyimide base material; and
   an adhesive layer comprising the adhesive varnish according to claim 1 provided on one or both surfaces of the polyimide base material.

7. The adhesive film according to claim 6, wherein the adhesive layer is 10 to 100 μm in thickness, and wherein the polyimide base material is 25 to 100 μm in thickness.

8. A wiring film, comprising:
   at least two adhesive films according to claim 6 arranged so that the adhesive layer of each adhesive film face each other; and
   a conductor wiring arranged between the two adhesive films,
   wherein the adhesive layers are fusion-bonded.

9. A wiring film, comprising:
   a double-sided adhesive film comprising the adhesive film according to claim 6 comprising the adhesive layer on both surfaces of the polyimide base material;
   two single-sided adhesive films comprising the adhesive film comprising the adhesive layer on one surface and arranged on both sides of the double-sided adhesive film so that the adhesive layers face each other; and
   a conductor wiring arranged between each of the two single-sided adhesive films and the double-sided adhesive film, wherein the adhesive layers are fusion-bonded.

10. The wiring film according to claim 8, wherein the conductor wiring is 35 to 500 μm in thickness.

11. An adhesive varnish, consisting of:
    100 parts by mass of a bisphenol A-type phenoxy resin comprising a plurality of hydroxyl groups in a side chain;
    2 to 55 parts by mass of a polyfunctional isocyanate compound selected from the group consisting of vinyl isocyanate, butyl isocyanate, hexyl isocyanate, octadecyl isocyanate, cyclohexyl isocyanate, phenyl isocyanate, methacryl isocyanate, 4-methylbenzyl isocyanate, 2-acryloyloxyethyl isocyanate, 2-methacryloyloxyethyl isocyanate, 1,1-bis(acryloxymethyl)-ethyl isocyanate, and 3-isocyanate propyltrimethoxysilane;
    5 to 30 parts by mass of a maleimide compound comprising a plurality of maleimide groups in a molecule thereof or/and a reaction product thereof;
    a low-boiling point solvent S1 consisting of methyl ethyl keytone;
    a high-boiling point solvent S2 consisting of cyclohexanone;
    optionally 0.001 to 0.1 parts by mass of an urethanization catalyst; and
    optionally 0.0002 to 1 part by mass of a radical polymerization inhibitor.

12. An adhesive film, comprising:
    a polyimide base material; and
    an adhesive layer comprising the adhesive varnish according to claim 11 provided on one or both surfaces of the polyimide base material.

13. A wiring film, comprising:
    at least two of the adhesive films according to claim 11 arranged so that the adhesive layer faces each other; and
    a conductor wiring arranged between the two adhesive films,
    wherein the adhesive layers are fusion-bonded.

* * * * *